United States Patent
Yu et al.

(10) Patent No.: US 8,053,276 B2
(45) Date of Patent: Nov. 8, 2011

(54) METHOD OF STACKING AND INTERCONNECTING SEMICONDUCTOR PACKAGES VIA ELECTRICAL CONNECTORS EXTENDING BETWEEN ADJOINING SEMICONDUCTOR PACKAGES

(75) Inventors: Cheeman Yu, Madison, WI (US); Chi-Chin Liao, Changhua (TW); Hem Takiar, Fremont, CA (US)

(73) Assignee: SanDisk Technologies, Inc., Plano, TX (US)

( * ) Notice: Subject to any disclaimer, the term of this patent is extended or adjusted under 35 U.S.C. 154(b) by 45 days.

(21) Appl. No.: 12/614,981

(22) Filed: Nov. 9, 2009

(65) Prior Publication Data
US 2010/0055835 A1    Mar. 4, 2010

Related U.S. Application Data

(62) Division of application No. 11/427,695, filed on Jun. 29, 2006, now Pat. No. 7,615,409.

(51) Int. Cl.
*H01L 21/44* (2006.01)
*H01L 21/48* (2006.01)

(52) U.S. Cl. .................. 438/107; 438/109; 438/127

(58) Field of Classification Search .......... 438/106, 438/107, 109, 125–127, 459, 977; 257/E25.013, 257/E25.023
See application file for complete search history.

(56) References Cited

U.S. PATENT DOCUMENTS

| | | | |
|---|---|---|---|
| 6,376,904 B1 | 4/2002 | Haba et al. | |
| 6,407,448 B2 | 6/2002 | Chun | |
| 6,451,626 B1 | 9/2002 | Lin | |
| 6,583,503 B2 | 6/2003 | Akram et al. | |
| 6,605,866 B1 | 8/2003 | Crowley et al. | |
| 6,794,741 B1 | 9/2004 | Lin et al. | |
| 6,977,431 B1 | 12/2005 | Oh et al. | |
| 6,984,885 B1 | 1/2006 | Harada et al. | |
| 6,987,314 B1 | 1/2006 | Yoshida et al. | |
| 7,045,396 B2 | 5/2006 | Crowley et al. | |
| 7,190,062 B1 | 3/2007 | Sheridan et al. | |
| 7,242,081 B1 | 7/2007 | Lee | |
| 7,429,787 B2 | 9/2008 | Karnezos et al. | |
| 7,550,834 B2 | 6/2009 | Yu et al. | |
| 7,615,409 B2 | 11/2009 | Yu et al. | |
| 7,652,376 B2 * | 1/2010 | Park et al. | 257/737 |
| 7,671,459 B2 * | 3/2010 | Corisis et al. | 257/686 |
| 2003/0042564 A1 | 3/2003 | Taniguchi et al. | |
| 2005/0012195 A1 | 1/2005 | Go et al. | |
| 2009/0256249 A1 | 10/2009 | Yu et al. | |

FOREIGN PATENT DOCUMENTS

EP    0669653 A    8/1995

(Continued)

OTHER PUBLICATIONS

International Search Report dated Dec. 5, 2007, PCT Application No. PCT/US2007/071881.

(Continued)

*Primary Examiner* — Hung Vu
(74) *Attorney, Agent, or Firm* — Vierra Magen Marcus & DeNiro LLP

(57) ABSTRACT

An electronic component is disclosed including a plurality of stacked semiconductor packages. A first such embodiment includes an internal connector for electrically coupling the stacked semiconductor packages. A second such embodiment includes an external connector for electrically coupling the stacked semiconductor packages.

7 Claims, 14 Drawing Sheets

FOREIGN PATENT DOCUMENTS

WO 2005112117 A 11/2005

OTHER PUBLICATIONS

Office Action dated Sep. 19, 2008, U.S. Appl. No. 11/427,689.
Response to Office Action filed Jan. 20, 2009, U.S. Appl. No. 11/427,689.
Notice of Allowance dated Feb. 6, 2009, U.S. Appl. No. 11/427,689.
Response to Office Action filed Jan. 5, 2011, U.S. Appl. No. 12/614,998.
Office Action mailed Dec. 28, 2010, U.S. Appl. No. 12/489,298.
Response to Office Action filed Jan. 31, 2011, U.S. Appl. No. 12/489,298.
U.S. Appl. No. 12/614,998, filed Nov. 9, 2009.
Office Action dated Oct. 5, 2010, U.S. Appl. No. 12/614,998.
Response to Office Action filed Jun. 21, 2011, U.S. Appl. No. 12/614,998.
Office Action dated May 19, 2011 in Taiwanese Patent Application No. 096120561.
Office Action mailed Mar. 21, 2011, U.S. Appl. No. 12/614,998.
Office Action mailed Apr. 19, 2011, U.S. Appl. No. 12/489,298.
Response to Office Action filed Jul. 19, 2011, U.S. Appl. No. 12/489,298.
Notice of Allowance dated Aug. 18, 2011, U.S. Appl. No. 12/489,298.

* cited by examiner

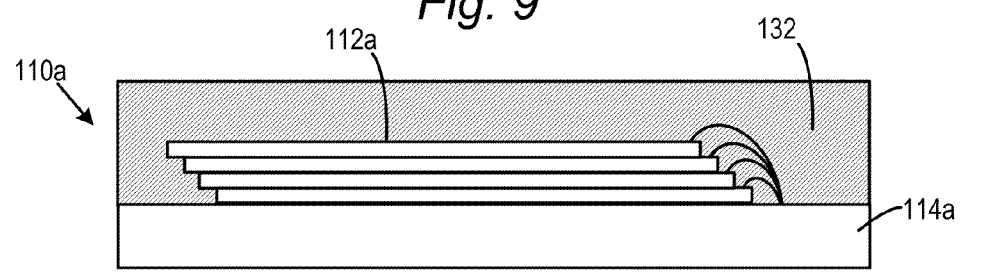
*Fig. 9*
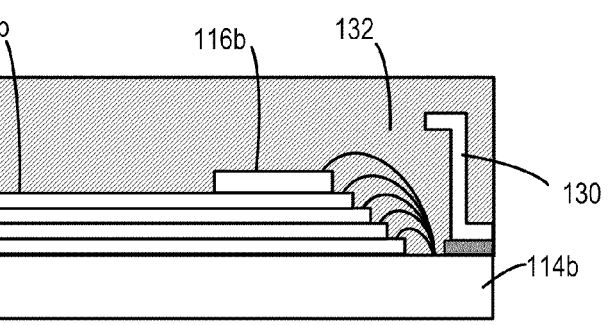
*Fig. 10*
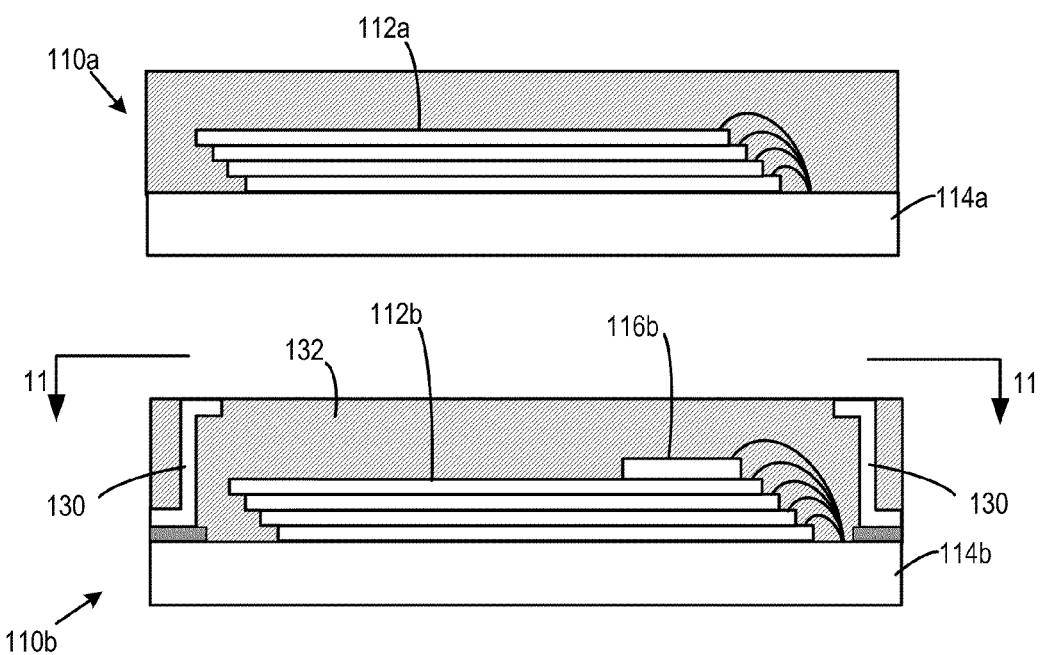

METHOD OF STACKING AND INTERCONNECTING SEMICONDUCTOR PACKAGES VIA ELECTRICAL CONNECTORS EXTENDING BETWEEN ADJOINING SEMICONDUCTOR PACKAGES

PRIORITY DATA

This application is a divisional of U.S. patent application Ser. No. 11/427,695 filed Jun. 29, 2006, entitled "METHOD OF STACKING AND INTERCONNECTING SEMICONDUCTOR PACKAGES VIA ELECTRICAL CONNECTORS EXTENDING BETWEEN ADJOINING SEMICONDUCTOR PACKAGES", which application is incorporated herein by reference in its entirety.

CROSS REFERENCE TO RELATED APPLICATION

The present application is related to U.S. Ser. No. 12/614,998, entitled "METHOD OF STACKING AND INTERCONNECTING SEMICONDUCTOR PACKAGES VIA ELECTRICAL CONNECTORS EXTENDING BETWEEN ADJOINING SEMICONDUCTOR PACKAGES", filed concurrently herewith.

BACKGROUND OF THE INVENTION

1. Field of the Invention

Embodiments of the present invention relate to an electronic component formed of a plurality of stacked semiconductor packages, and a method of forming the electronic component.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate. The substrate may in general include a rigid base having a conductive layer etched on one or both sides. Electrical connections are formed between the die and the conductive layer(s), and the conductive layer(s) provide an electric lead structure for integration of the die into an electronic system. Once electrical connections between the die and substrate are made, the assembly is then typically encased in a mold compound to provide a protective package.

Flash memory modules may either be portable, as in the case of a land grid array (LGA) package, or dedicated, as in the case of a ball grid array (BGA) package. Portable flash memory modules are fabricated with contact pads that allow the modules to be used as removable memory. They may be inserted into a slot in a host device, whereupon the contact pads are brought into pressure contact with a printed circuit board in the host device to allow communication between the memory module and host device. Dedicated memory modules on the other hand are soldered, or otherwise permanently affixed to the printed circuit board of a host device.

A cross-section of a conventional BGA package 40 is shown in FIG. 1. One or more memory die 20 and a controller die 22 are mounted on a substrate 24 in a stacked configuration. Generally, the substrate 24 may be formed of a rigid core 28, of for example BT (Bismaleimide Triazine) laminate. Thin film copper layer(s) 30 may be formed on the top and bottom surfaces of the core in a desired electrical lead pattern using known photolithography and etching processes. Areas of the conductance pattern may be plated to receive solder balls 32 or other soldered contacts.

The substrate may be coated with a solder mask 36 to insulate and protect the electrical lead pattern formed on the substrate. The die may be electrically connected to the substrate by wire bonds 34. Vias (not shown) are formed through the substrate to allow electrical connection of the die through the substrate to the solder balls 32. Once the die are electrically connected, the package may be encapsulated in a mold compound 38 to form the package 40. The package 40 may thereafter be mounted by the solder balls 32 to a printed circuit board within a host device (not shown) in a known reflow process.

There is an ever-present drive to increase storage capacity within memory modules. One method of increasing storage capacity is to increase the number of memory die used within the package. In portable memory packages, the number of die which may be used is limited by the thickness of the package, which must not exceed a thickness of a standard-sized slot in the host device within which the memory module is received. However, even where the thickness of a package is not limited by standard, as in a dedicated memory module, typically no more than 4 or 5 die may be stacked within a given package. The more die that are added within a package, the greater the likelihood that one or more of them will be damaged during human or automated assembly. And as the number of die goes up, package yields go down. If a single die within a package is faulty, the package must be discarded, and the good die wasted. Moreover, large numbers of die within a package draw a significant amount of current during testing and operation to power up the package.

It is therefore known to stack semiconductor packages together. For example, U.S. Pat. No. 6,407,448 entitled, Stackable Ball Grid Array Semiconductor Package and Fabrication Method Thereof, discloses a support structure within which a semiconductor die is seated. The support structure has metal traces formed on its bottom surface. A second layer of traces are then affixed on top of the die using adhesive, and connected to the die and support structure. Solder balls are then provided on top of the second layer of metal traces. A second package may then be stacked atop the first package by soldering the solder balls of the first package to the metal traces on the bottom surface of the second package.

Conventional stacked semiconductor packages have a variety of drawbacks. For example, in the design shown in the above-described U.S. Pat. No. 6,407,448, there is significant additional structure required to make the packages stackable. This significant additional structure increases the processing steps necessary to fabricate the package assembly, and adds time and expense to the fabrication process.

SUMMARY OF THE INVENTION

Embodiments of the invention, roughly described, relate to an electronic component including a plurality of stacked semiconductor packages. A first such embodiment includes an internal connector for electrically coupling the stacked semiconductor packages. A second such embodiment includes an external connector for electrically coupling the stacked semiconductor packages.

The first embodiment of the present invention, referred to herein as an internal lead stacked semiconductor package assembly, may be batch processed from a pair of substrate panels. The first panel may include a plurality of integrated circuit (IC) assemblies each having, for example, a plurality of memory die electrically coupled to a substrate. The second panel may include a plurality of IC assemblies each having, for example, a plurality of memory die and a controller die electrically coupled to a substrate.

A plurality of internal connectors may be attached to contact pads formed on a first of the IC assemblies. The internal connectors may be formed out of the material of a conventional lead frame, such as for example copper alloy 4 to 6 mils thick. The shape of the internal connectors may generally have a base portion for mating with the contact pads on the first IC assembly, a neck portion extending away from the base portion, and a head portion for being connected to a bottom of the second IC assembly. The neck portion preferably has a length sufficient to position the head portion above the uppermost die in the first IC assembly as well as any wire bonds extending therefrom. The internal connectors may be provided along one, two, three or four edges of the IC assembly.

The first and second IC assemblies may next be encapsulated in a mold compound in a conventional encapsulation process. The internal connectors on the first IC assembly may be completely encased within the molding compound, and thereafter the molding compound may be ground down so that a surface of the head portion of the internal connectors is exposed at the surface of the first IC assembly.

After the encapsulation and grinding steps, the IC assemblies may be singulated from their respective panels to define a plurality of semiconductor packages. Once cut into semiconductor packages, the packages from different panels may be joined together to form the internal connector stacked semiconductor package assembly. The packages are joined with the contact pads of the second package electrically coupled with the head portion of electrical connectors from the first package.

In embodiments where the internal connector stacked semiconductor package assembly is to be a BGA device, solder balls may be tacked to contact pads on the bottom of the assembly.

The second embodiment of the present invention is referred to herein as an external connector stacked semiconductor package assembly. IC assemblies are formed on first and second substrate panels as described with respect to the first embodiment. The IC assemblies may then be encapsulated in a mold compound, using a chase having a plurality of protrusions which define a plurality of recesses along one or more edges within a surface of the mold compound.

After the encapsulation, the IC assemblies may be singulated from their respective panels to define a plurality of semiconductor packages. Once cut into semiconductor packages, a plurality of external connectors may be affixed to a first of the semiconductor packages. Each external connector may in general be "C"-shaped with a base portion lying in contact with contact pads on an unencapsulated surface of the first package, a neck portion lying along and adjacent to the outer edge of the first package, and a head portion which fits into a recess in the mold compound. External connectors may be formed out of the material of a conventional lead frame, and may be provided along one, two, three or all four edges of the first semiconductor package.

After the external connectors are applied, the semiconductor packages may be joined together to form the external connector stacked semiconductor package assembly. The first and second packages are joined with the contact pads of the second package electrically coupled with the head portion of the external connector. In embodiments where the external connector stacked semiconductor package assembly is to be a BGA package, solder balls may be tacked to contact pads on a bottom surface of the device.

The internal connectors and external connectors of the above described embodiments serve to electrically couple the semiconductor packages in the assembly to each other. As would be appreciated by those of skill in the art, the conductance pattern(s) in the respective semiconductor packages may be configured in a known manner such that, once the packages are coupled together via the internal/external electrical connectors, the semiconductor die in one package are electrically coupled to the semiconductor die and/or the solder balls or other external electrical connector in the second package.

DESCRIPTION OF THE DRAWINGS

FIGS. 9-10 are side views of a pair of integrated circuit assemblies according to the present invention in various stages of fabrication.

DETAILED DESCRIPTION

Embodiments will now be described with reference to FIGS. 2 through 22, which roughly described, relate to a stacked semiconductor package assembly. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
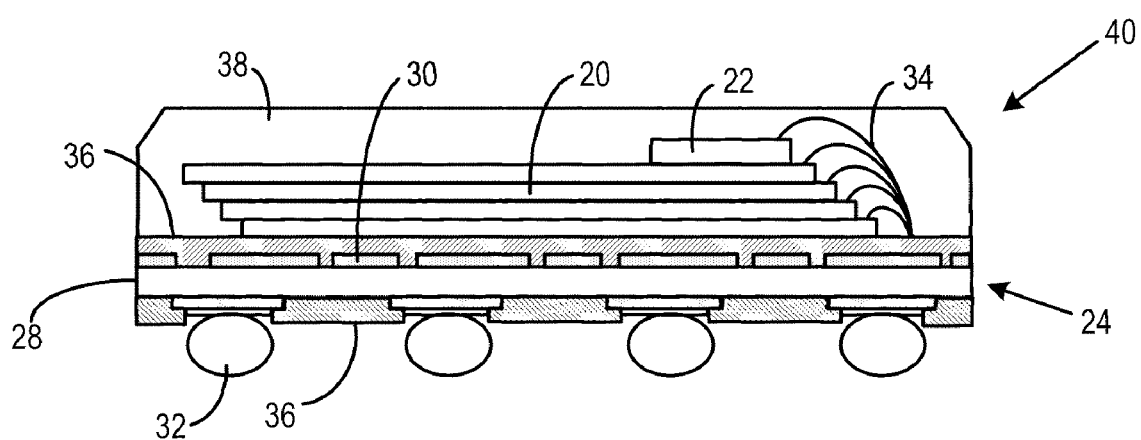
FIG. 1 is a cross-sectional side view of a conventional BGA package.
Figure 2:
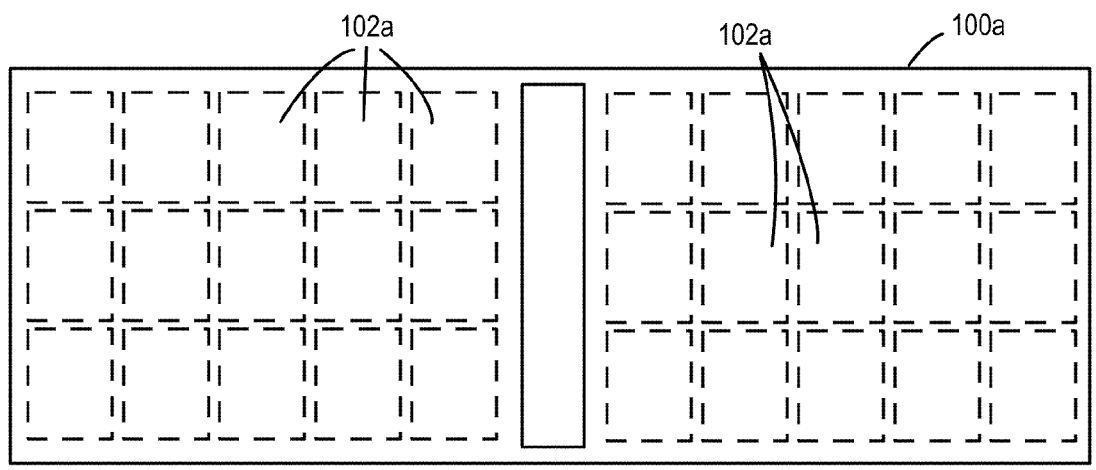
FIG. 2 is a top view of a pair of substrate panels from which a plurality of stacked semiconductor package assemblies according to the present invention may be made.
Figure 2:
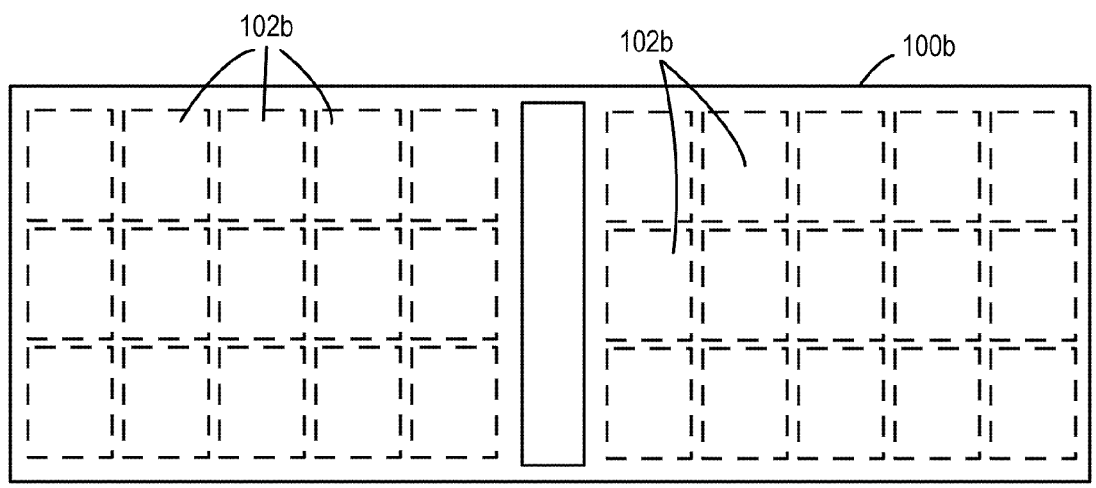

A first embodiment of the present invention, referred to herein as an internal lead stacked semiconductor package assembly, will now be explained with reference to FIGS. 2 through 13. FIG. 2 shows a top view of a pair of substrate panels 100a and 100b. The panels 100a and 100b include a plurality of package outlines 102a and 102b, respectively, at which positions individual semiconductor packages will be fabricated as explained hereinafter. It is understood that the layout of panels 100a and 100b, as well as the number of rows and columns of package outlines 102a, 102b on panels 100a, 100b may vary in alternative embodiments. Moreover, the panels 100a and 100b are shown having the same configuration, and having the same number of rows and columns of package outlines as each other. It is understood that the configuration and/or the number of rows and columns on panel 100a may be different than that of panel 100b in alternative embodiments.

Substrate panels 100a, 100b may be a variety of different chip carrier mediums, including a PCB, a leadframe or a tape automated bonded (TAB) tape. Where substrate panels 100a, 100b are PCBs, each substrate panel may be formed of a core having a top conductive layer and a bottom conductive layer. The core may be formed of various dielectric materials such as for example, polyimide laminates, epoxy resins including FR4 and FR5, bismaleimide triazine (BT), and the like. Although not critical to the present invention, the core may have a thickness of between 40 microns (μm) to 200 μm, although the thickness of the core may vary outside of that range in alternative embodiments. The core may be ceramic or organic in alternative embodiments.

The conductive layers surrounding the core may be formed of copper or copper alloys, plated copper or plated copper alloys, Alloy 42 (42Fe/58Ni), copper plated steel, or other metals and materials known for use on substrate panels. The conductive layers may have a thickness of about 10 μm to 24 μm, although the thickness of the layers may vary outside of that range in alternative embodiments.

Figure 3:
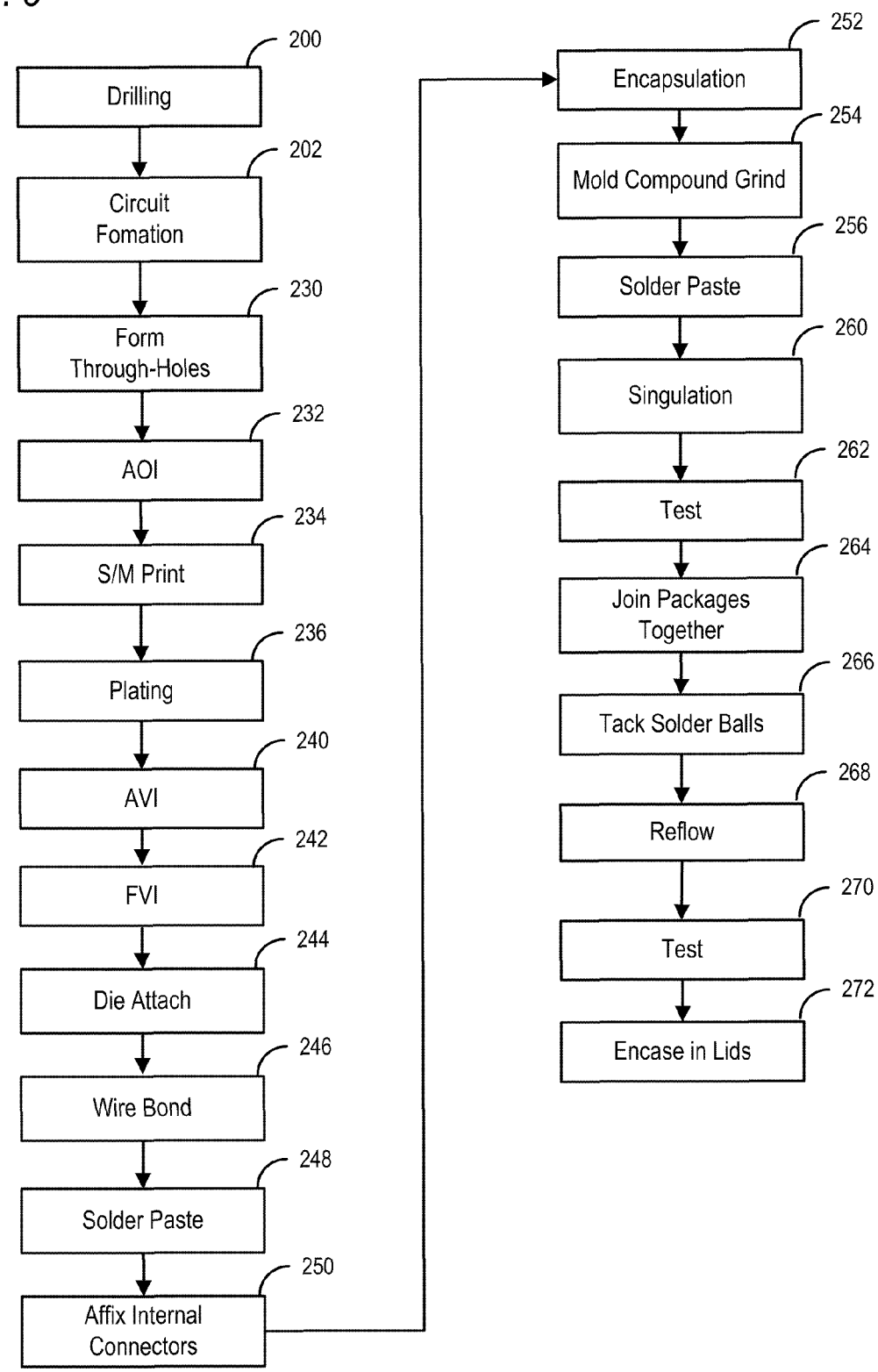
FIG. 3 is a flowchart of the overall fabrication process of an internal lead stacked semiconductor package assembly according to embodiments of the present invention.

FIG. 3 is a flowchart of the fabrication process for forming an internal lead stacked semiconductor assembly according to embodiments of the present invention. In a step 200, the panels 100a and 100b are drilled to define through-holes in the substrate. While step 200 is described as a single step in which both panels 100a and 100b are drilled, it is understood that panel 100a may be drilled at a different time and in a different process than panel 100b. The same is true in the description of the following steps unless otherwise indicated.

Figure 4:
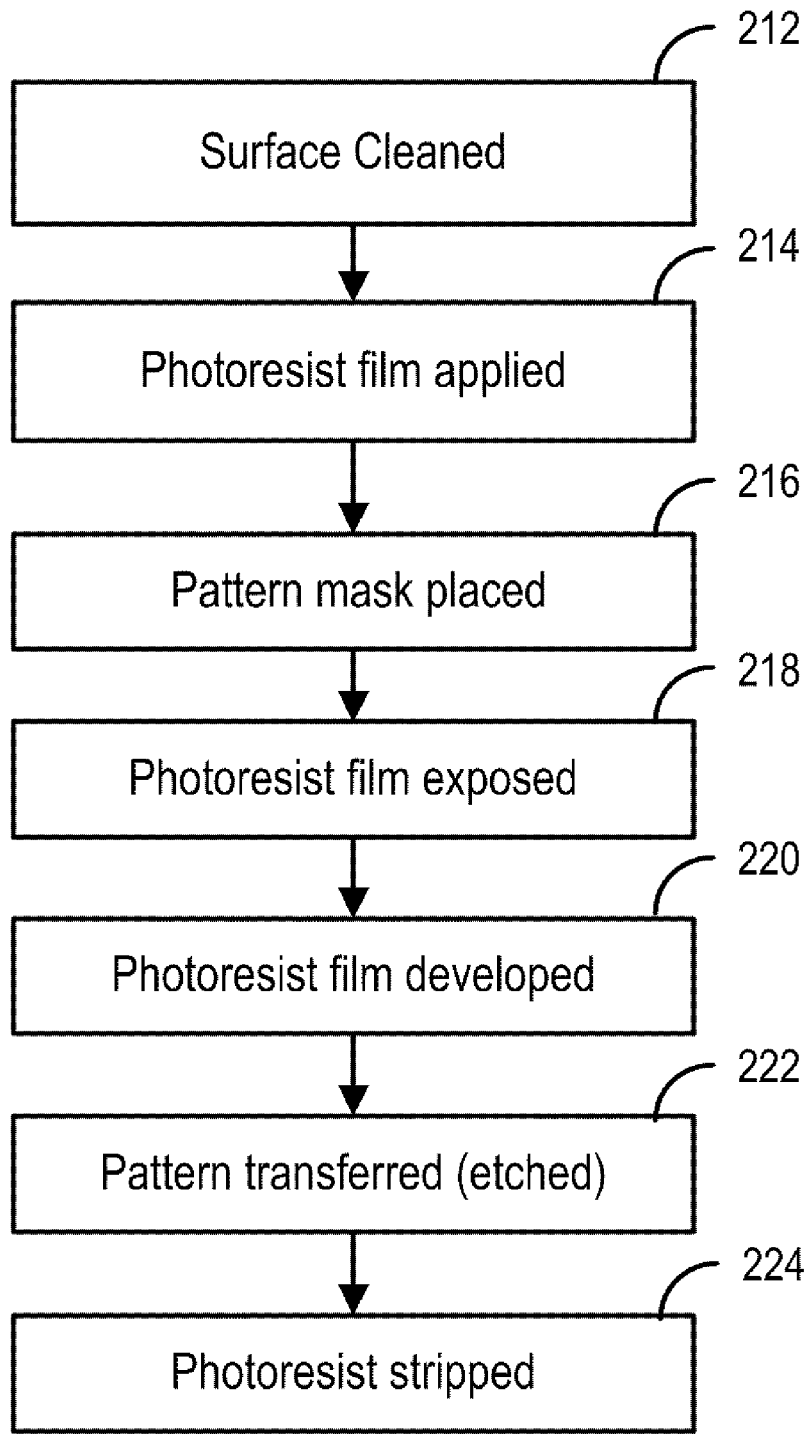
FIG. 4 is a flowchart of a photolithography process for forming conductance patterns on the substrates used in the present invention.

Conductance patterns are next formed on the respective conductive layers in each panel in step 202. In particular, as shown in the flowchart of FIG. 4, the surfaces of the conductive layers are cleaned in step 212. A photoresist film is then applied over the conductive layers in step 214. A pattern mask containing the outline of the electrical conductance pattern may then be placed over the photoresist film in step 216. The photoresist film is exposed (step 218) and developed (step 220) to remove the photoresist from areas on the conductive layers that are to be etched. The exposed areas are next etched away using an etchant such as ferric chloride in step 222 to define the conductance patterns on the core. Next, the photoresist is removed in step 224. Other known methods for forming the conductance pattern on the substrate panels 100a, 100b are contemplated. The conductance patterns on panel 100a may be the same or different than the conductance patterns on panel 100b.

Referring again to FIG. 3, the panel may then be inspected in an automatic optical inspection (AOI) in step 232. Once inspected, the solder mask is applied to the panel in step 234. After the solder mask is applied, solder areas on the conductance patterns of each panel 100a, 100b may be plated with a Ni/Au, Alloy 42 or the like in step 236 in a known electroplating or thin film deposition process. In embodiments, the stacked semiconductor package assembly may be used as an LGA package including plated contact fingers. In such embodiments, the fingers may be plated first with a soft plating layer and then a hard plating layer to reduce wear on the contact fingers. Alternatively, the fingers may be plated in a single plating process.

Figure 5:
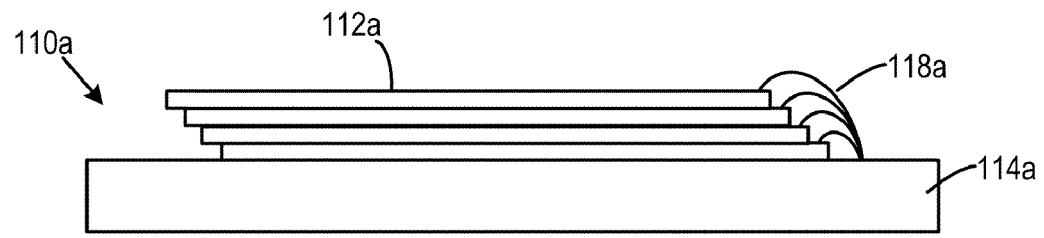
FIGS. 5-7 are side views of a pair of integrated circuit assemblies according to the present invention in various stages of fabrication.
Figure 6:
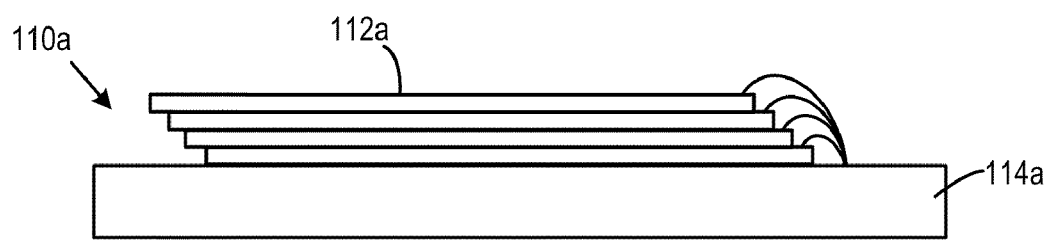

The respective substrate panels may then be inspected and tested in an automated inspection process (step 240) and in a final visual inspection (step 242) to check electrical operation, and for contamination, scratches and discoloration. The substrate panels that pass inspection are then sent through the die attach process in step 244 and as described with reference to the side view of FIG. 5. FIG. 5 shows an integrated circuit (IC) assembly from each of panels 100a and 100b, fabricated as described above. IC assembly 110a shown is one of the plurality of IC assemblies being fabricated on panel 100a, and IC assembly 110b shown is one of the plurality of substrate assemblies being fabricated on panel 100b. While the IC assemblies 110a and 110b are shown in FIGS. 5-7 and 9-11 as being adjacent to each other, the panels 100a and 100b including IC assemblies 110a and 110b may in fact be remote from each other until they are joined as explained hereinafter with respect to FIG. 13.

IC assembly 110a may include a plurality of memory die 112a mounted on substrate 114a. Similarly, IC assembly 110b may include a plurality of memory die 112b mounted on substrate 114b. FIG. 5 shows the semiconductor die 112a, 112b stacked in an offset arrangement on the substrates 114a, 114b. The offset allows electrical leads to be connected to each of the semiconductor die in the stack, at the edges of the die. Alternatively, the die could be stacked in an aligned configuration and be separated by a silicon spacer as is known in the art. The one or more die may have thicknesses ranging between 2 mils to 20 mils, but the one or more die may be thinner than 2 mils and thicker than 20 mils in alternative embodiments.

The die 112a, 112b may be for example flash memory chips (NOR/NAND), SRAM and/or DDT. In embodiments, each IC assembly 110a, 110b may include four memory die, though it is understood that each assembly may include more or less than that in alternative embodiments. One of the IC assemblies 110a, 110b may further include a controller chip, such as for example controller chip 116b on assembly 110b, for controlling I/O for the memory chips 112a and 112b. The controller chip may for example be an ASIC. Other silicon chips are contemplated in addition to or instead of the memory and controller chips described above.

FIGS. 5-14 are views of the internal connector stacked semiconductor package assembly in the successive fabrication stages described in the flowchart of FIG. 3. As shown in side view of FIG. 5, wire bonds 118a, 118b may be made between the die and the substrates in a step 246. As shown in the side view of FIG. 6, solder paste may be added to IC assembly 110b in step 248 to define contact pads 120 along opposed edges of the top surface of IC assembly 110b.

Figure 7:
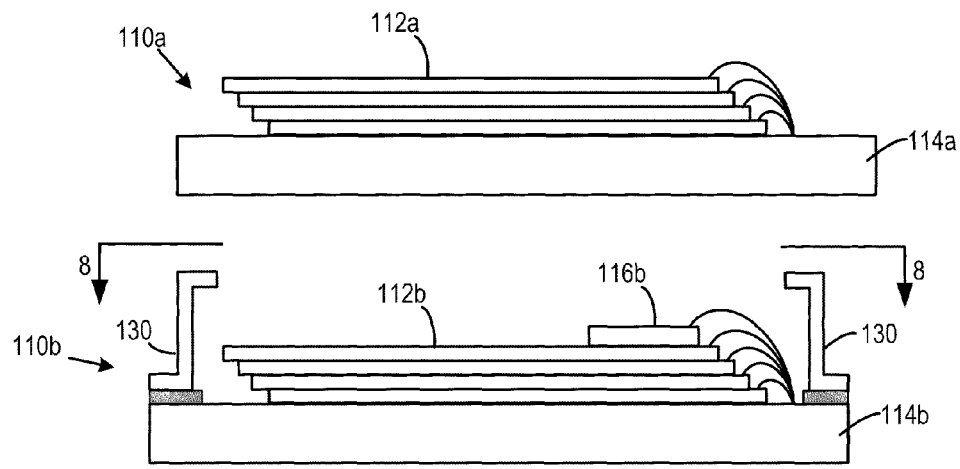

Referring now to FIG. 7, internal connectors 130 may be attached to contact pads 120 on the upper surface of IC assembly 110b in step 250. Internal connectors 130 may be formed out of the material of a conventional lead frame, such as for example copper alloy or alloy 42 which is 4 mils to 6 mils thick. The type of material and the thickness of the material may vary in alternative embodiments. The shape of the internal connectors 130 may generally have a first, base portion for mating with contact pads 120, a second, neck portion extending away from the base, and a third, head portion for being connected to a bottom of IC assembly 110a as explained hereinafter. The neck portion preferably has a length sufficient to position the head portion above the uppermost die in IC assembly 110b as well as any wire bonds extending therefrom. In FIG. 7, the neck of internal connector 130 is shown as being generally perpendicular to the base and head portions. It is understood that the neck portion may form oblique angles with respect to the base and head portions in further embodiments of the present invention.

While the internal connectors 130 are shown in FIG. 7 as having a generally "Z"-shaped configuration, it is understood that the connectors 130 may have alternative configurations. Such additional configurations include for example either of a forward or backward "C"-shape with parallel base and head portions and a neck portion extending therebetween. In a further embodiment, the connectors 130 may be generally "T"-shaped, with the neck portion extending upward from the middle of the base portion and/or downward from the middle of the head portion. Other shapes are contemplated.

Figure 8:
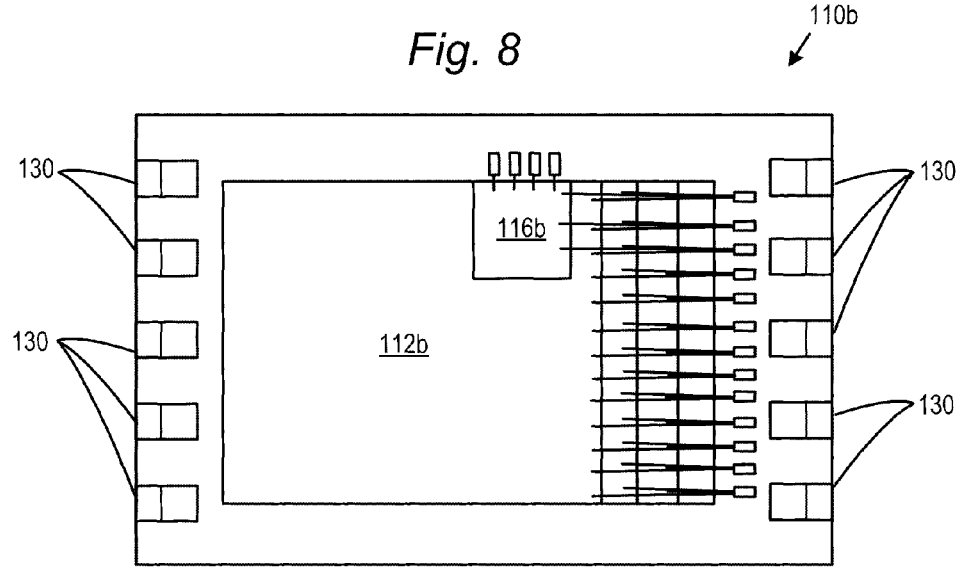
FIG. 8 is a top view of an integrated circuit assembly including internal connectors according to an embodiment of the present invention.

FIG. 8 is a top view from line 8-8 in FIG. 7. As shown therein, the internal connectors 130 and contact pads 120 are provided along opposed edges of IC assembly 110b. In further embodiments of the present system, it is understood the contact pads 120 and internal connectors 130 affixed thereto may be provided along one edge, three edges, or all four edges of IC assembly 110b. While five internal connectors are shown on each of the two opposed sides of IC assembly 110b, it is understood that many more than five internal connectors may be provided in embodiments of the present invention.

Referring now to FIG. 9, IC assemblies 110a and 110b may next be encapsulated in a mold compound 132 in a step 252. Mold compound 132 may be an epoxy such as for example that available from Sumitomo Corp. and Nitpo Denko Corp., both having headquarters in Japan. Other mold compounds from other manufacturers are contemplated. The mold compound may be applied according to various known processes, including by transfer molding or injection molding techniques to encapsulate substrates 114a, 114b, die 112a, 112b and 116b, and internal connectors 130.

Figure 11:
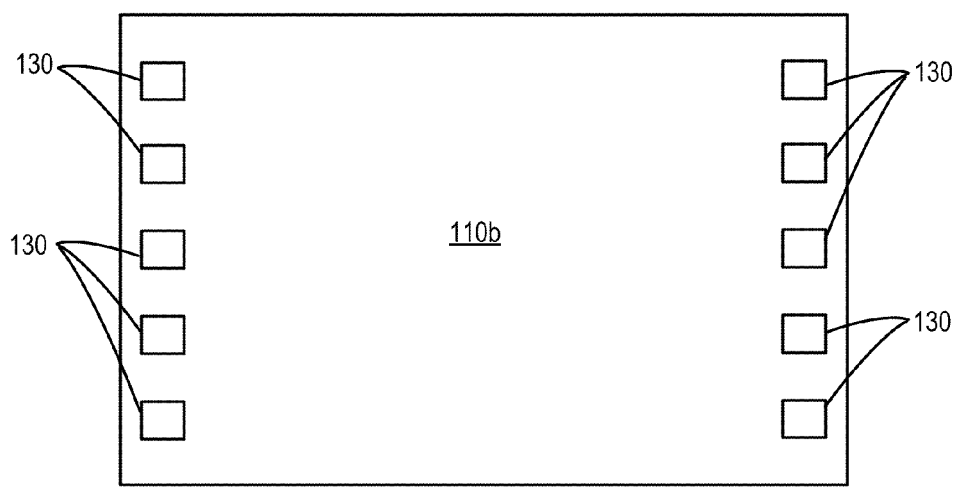
FIG. 11 is a top view of an encapsulated integrated circuit assembly with the internal connectors exposed through a surface of a mold compound.

Referring to FIGS. 10 and 11, mold compound 132 on IC assembly 110b may next be ground down so that a surface of the head portion of the internal connectors 130 are exposed at the surface of IC assembly 110b (step 254). As an alternative to grinding mold compound 132 in step 254, it is understood that the neck portion of internal connectors 130 may have a length so that the head portions of the internal connectors are flush with the surface of the mold compound 132 after the molding step. Alternatively, the neck portion of internal connectors 130 may have a length so that the head portions of the internal connectors protrude through the top of mold compound 132 at the encapsulation process. Thereafter, the head portions of connectors 130 may be left to protrude slightly above the surface of the mold compound, or the head portions may be ground to be flush with the surface of the mold compound.

Figure 12:
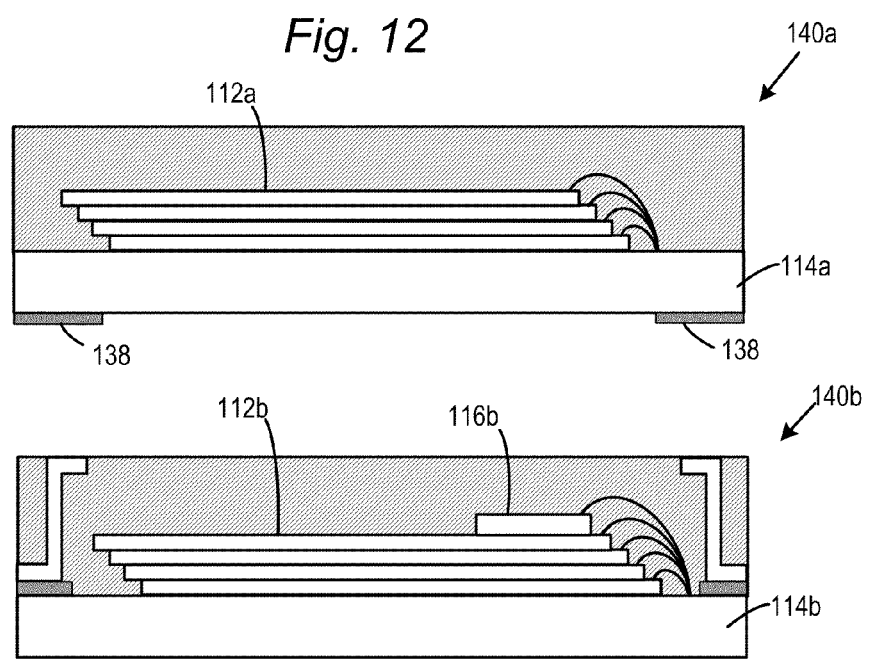
FIGS. 12-14 are side views of a pair of integrated circuit assemblies according to the present invention in various stages of fabrication.

Referring now to the side view of FIG. 12, solder paste may next be added to exposed contacts on a lower surface of IC assembly 110a to form contact pads 138 in step 256. After the contact pads 138 are formed, the IC assemblies 110a, 110b may be singulated from panels 100a, 100b to form finished semiconductor packages 140a and 140b in step 260 and as indicated in FIG. 12. Each semiconductor package 140a and 140b may be singulated by sawing along straight lines. However, a variety of cutting methods other than sawing may be used in alternative embodiments, such as for example, water jet cutting, laser cutting, water guided laser cutting, dry media cutting, and diamond coating wire cutting. While straight line cuts will define generally rectangular or square shaped semiconductor packages 140a, 140b, it is understood that semiconductor packages 140a and 140b may have shapes other than rectangular and square in further embodiments of the present invention.

Once cut into packages 140a, 140b, the packages may be separately tested in a step 262 to determine whether the packages are functioning properly. As are known in the art, such testing may include electrical testing, burn in and other tests.

Figure 13:
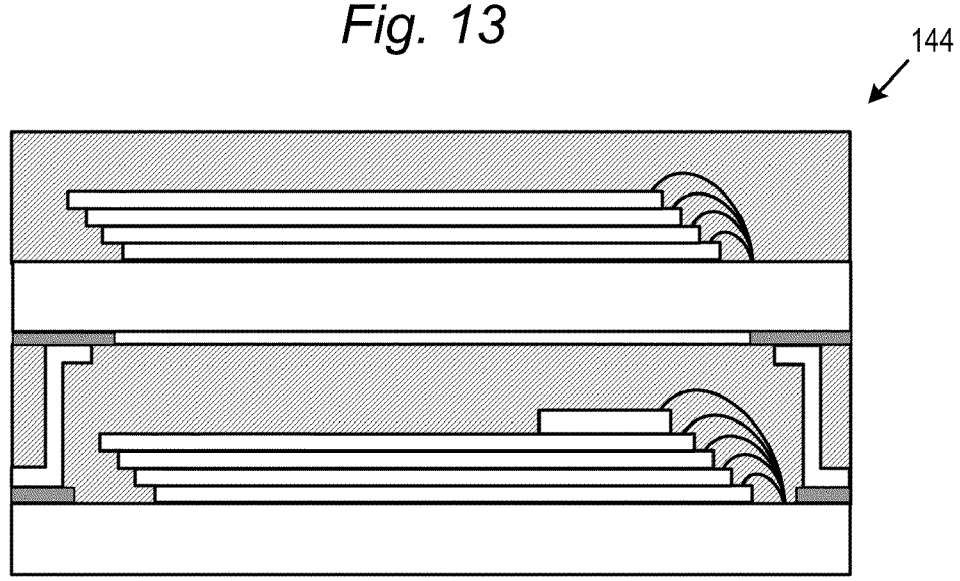

Referring now to FIG. 13, the packages 140a and 140b may be joined together in a step 264 to form internal connector stacked semiconductor package assembly 144 shown in FIG. 13. The packages 140a and 140b are joined with the contact pads 138 of package 140a electrically coupled with the head portion of electrical connectors 130 in package 140b. The package 140a may be aligned to the package 140b for coupling using a fixture of known construction. In alternative embodiments of the present invention, it is understood that panel 100a may be aligned with and connected to panel 100b. After the panels are connected, they may then be singulated.

Figure 14:
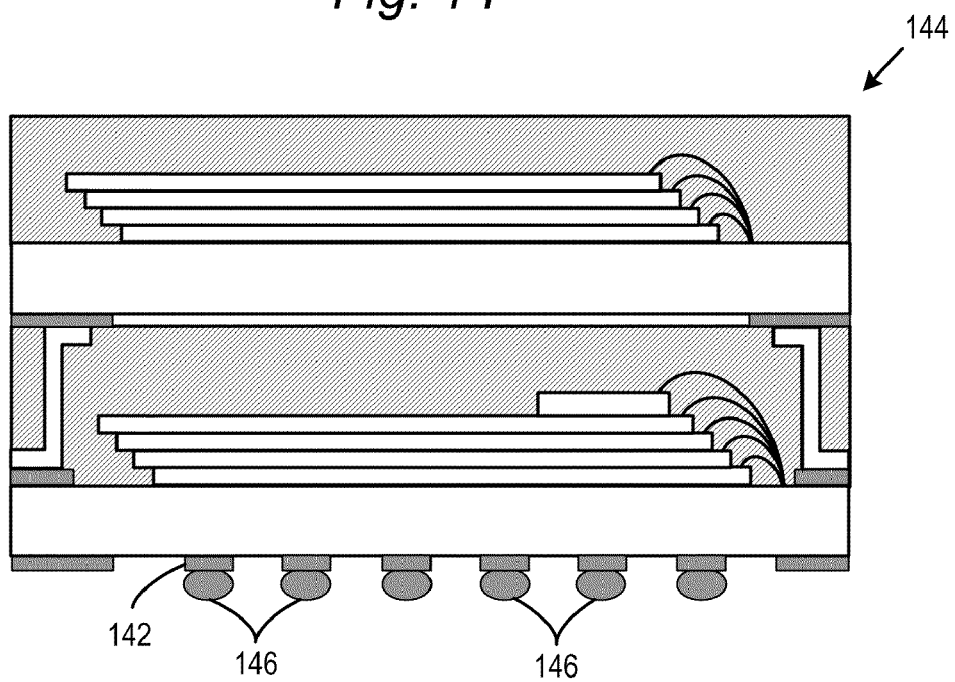

In embodiments where the internal connector stacked semiconductor package assembly 144 is to be a BGA package, solder balls may be affixed to the package assembly 144. As shown in FIG. 14, solder paste 142 may be applied to the grid of metal contacts on the lower surface of assembly, and the solder balls 146 may be tacked to solder paste 142 in step 266. Where the internal lead stacked semiconductor package assembly is used as a portable device, step 266 may be omitted. Whether assembly 144 is a BGA package with solder balls 146 or an LGA package, all solder connections may be cured in a reflow process in step 268. These solder connections include those between the packages 140a, 140b and the electrical connectors 130, and, where applicable, the solder balls 146.

The assembly 144 may be tested in a step 270. In embodiments where assembly 144 comprises a portable semiconductor device, the assembly 144 may be encased within lids in a step 272. When the assembly 144 is used as a dedicated device soldered to a motherboard of a host device, step 272 may be omitted.

Figure 15:
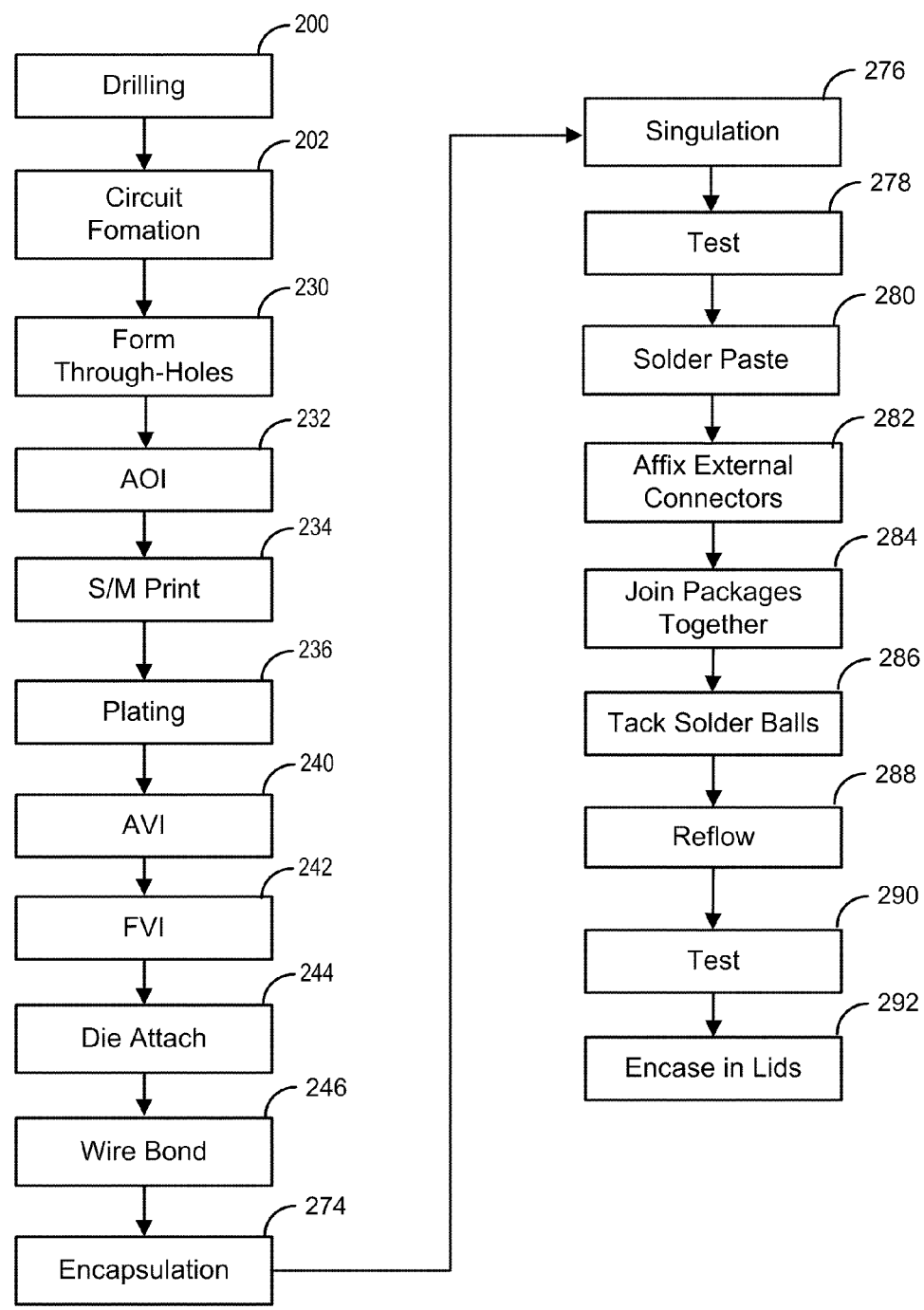
FIG. 15 is a flowchart of the overall fabrication process for forming an external connector stacked semiconductor package assembly according to embodiments of the present invention.
Figure 16:
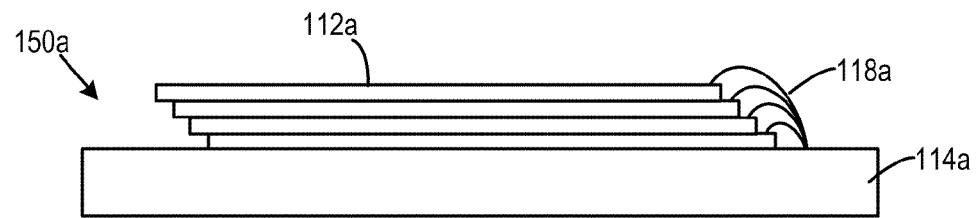
FIG. 16 is a side view of a pair of integrated circuit assemblies according to the present invention during fabrication.
Figure 16:
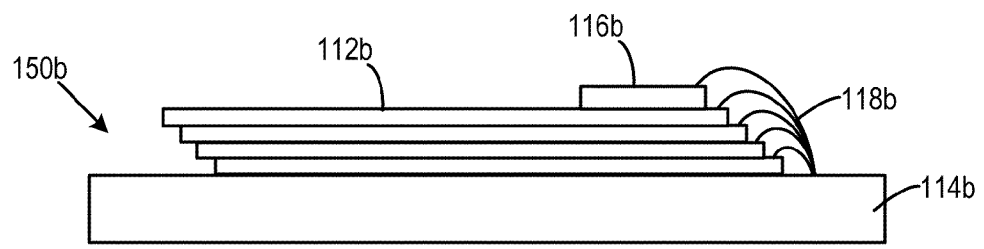

A further embodiment of the present invention, referred to herein as an external connector stacked semiconductor package assembly, will be explained with reference to the flowchart of FIG. 15, and the views of FIGS. 16-22. Referring first to the flowchart of FIG. 15, steps 200-246 as described above may be repeated to provide the IC assemblies 150a and 150b shown in FIG. 16. As described above with respect to IC assemblies 140a and 140b, assemblies 150a, 150b may include a plurality of die, such as for example for memory die 112a on IC assembly 150a and memory die 112b and a controller die 116*b* on IC assembly 150*b*. The die may be wire bonded to a substrate 114*a* and 114*b* formed as described above.

Figure 17:
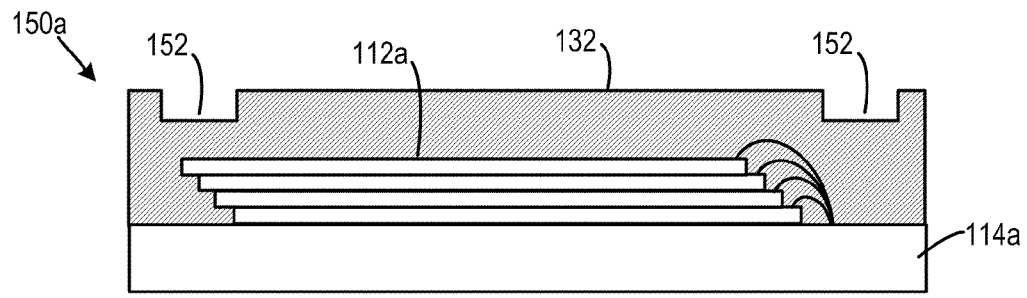
FIG. 17 is a cross-sectional side view of a pair of integrated circuit assemblies according to the present invention during fabrication.
Figure 17:
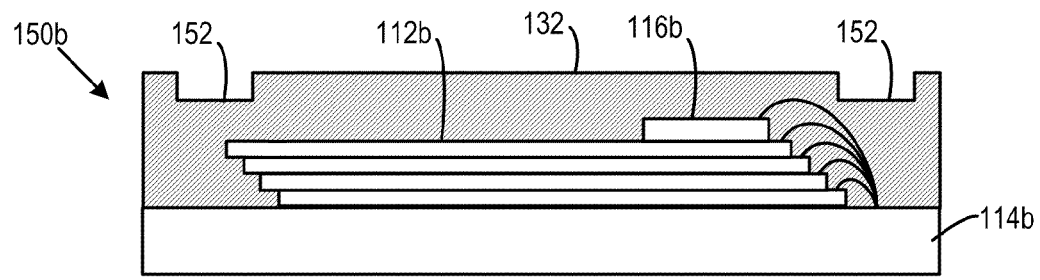
Figure 18:
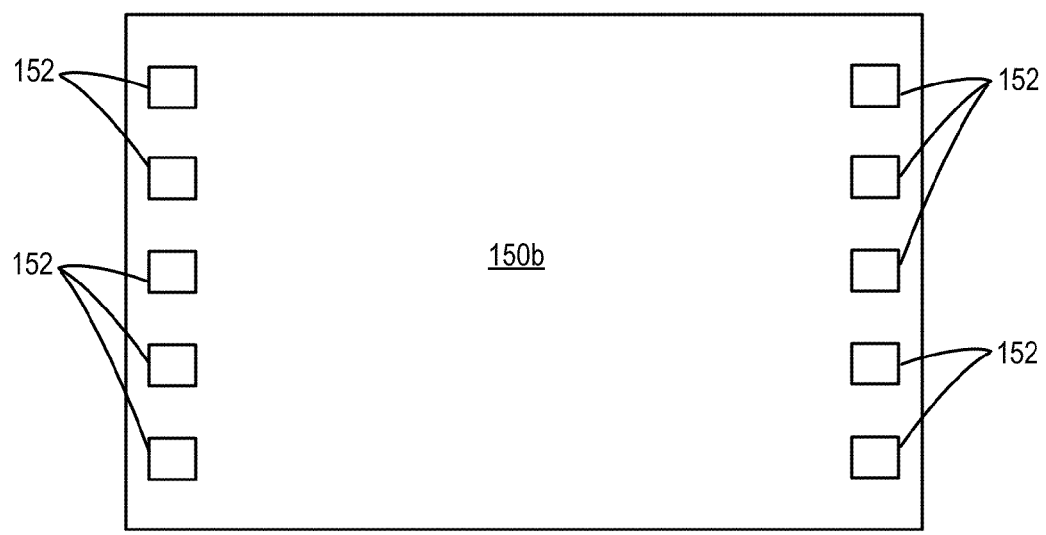
FIG. 18 is a top view of an encapsulated integrated circuit assembly according to the present invention including recesses formed in the mold compound.

Referring now to the cross-sectional view of FIG. 17, the IC assemblies 150*a*, 150*b* may be encapsulated in a mold compound 132 in a step 274. As shown in FIG. 17 and the top view of FIG. 18, the mold chase used in the encapsulation process may include a plurality of protrusions which define a plurality of recesses 152 along one or more edges within a surface of mold compound 132. It is understood that the recesses 152 may be formed into the surface of the mold compound 132 after the encapsulation step in alternative embodiments.

While the figures show recesses 152 formed in both the IC assembly 150*a* and the IC assembly 150*b*, the recesses 152 are used only in IC assembly 150*b* as explained hereinafter. In embodiments, IC assemblies 150*a*, 150*b* are encapsulated using the same molding chase, and as such recesses 152 may be formed in both IC assemblies 150*a* and 150*b*. In alternative embodiments, recesses 152 may be omitted from IC assembly 150*a*.

Figure 19:
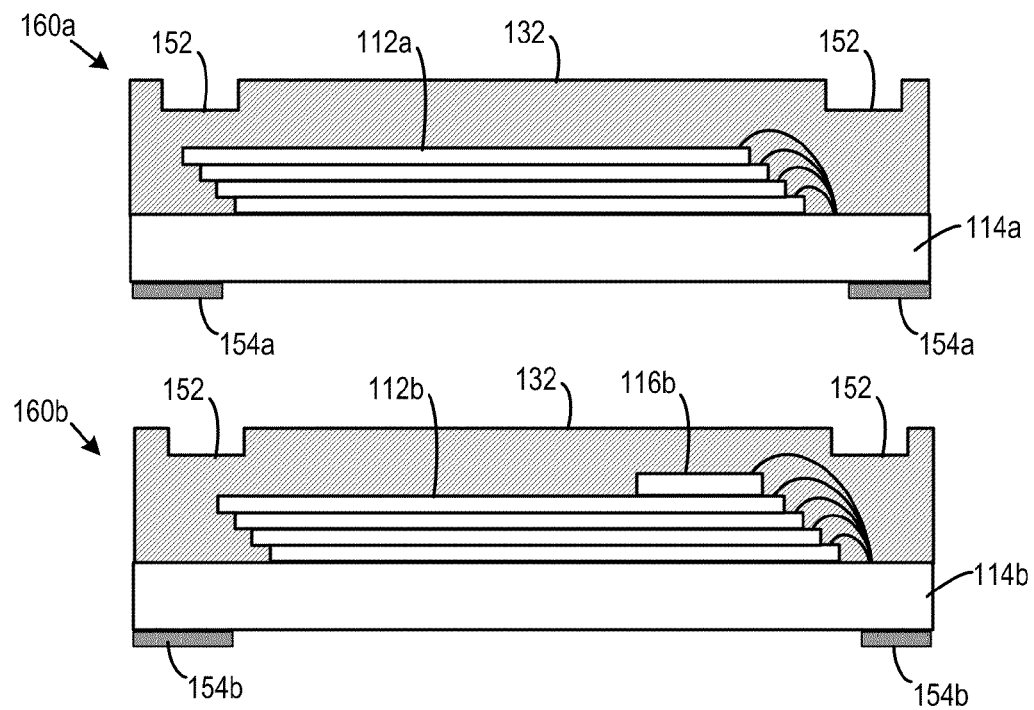
FIGS. 19-22 are cross-sectional side views of a pair of integrated circuit assemblies according to an embodiment of the present invention in various stages of fabrication.

Referring now to the cross-sectional view of FIG. 19, after encapsulation, the individual IC assemblies 150*a* may be singulated from panel 100*a* in step 276 to form a finished semiconductor package 160*a*. Similarly, the individual IC assemblies 150*b* may be singulated from panel 100*b* in step 276 to form finished semiconductor package 160*b*. After singulation step 276, the semiconductor packages 160*a* and 160*b* may be tested in a step 278. As also shown in FIG. 19, solder paste may be applied to the bottom surfaces of semiconductor packages 160*a* and 160*b* in step 280 to define contact pads 154*a* and 154*b*, respectively.

Figure 20:
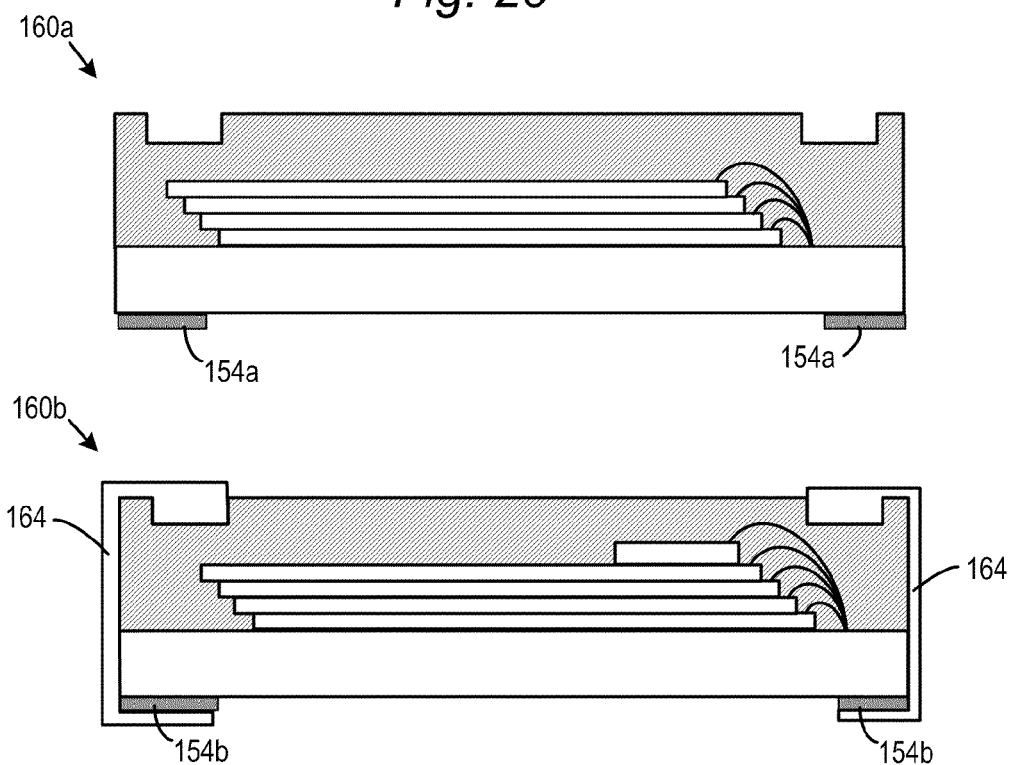
Figure 21:
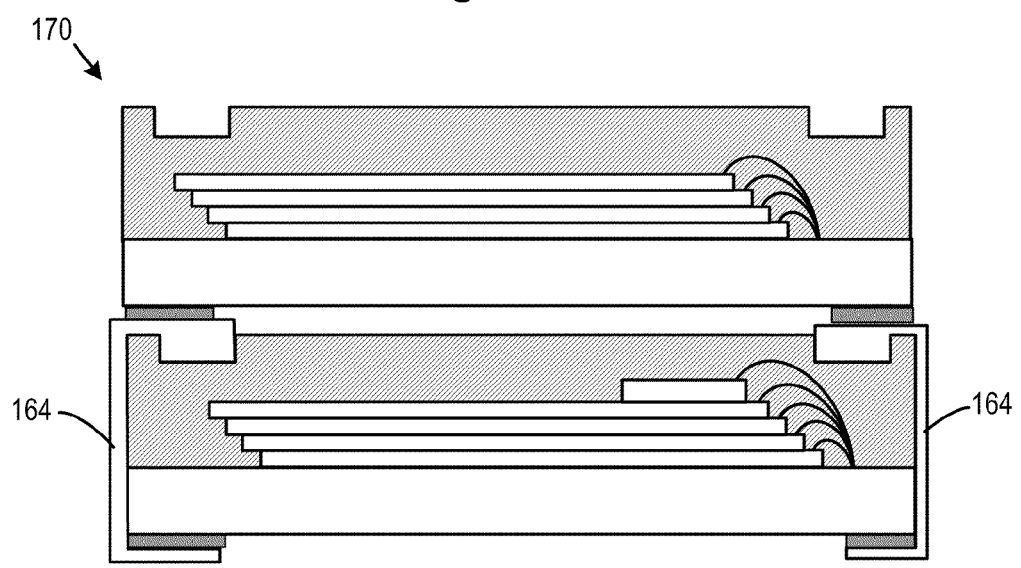

As seen in FIG. 20 and described with respect to step 282, after formation of the contact pads, external connectors 164 may be affixed to semiconductor package 160*b*. Each external connector 164 may in general be "C"-shaped with a first, base portion lying in contact with contact pads 154*a*, a second, neck portion lying along and adjacent to the outer edge of package 160*b*, and a third, head portion which fits into a recess 152. External connectors 164 may be formed out of the material of a conventional lead frame, such as for example copper alloy or alloy 42 which is 4 mils to 6 mils thick. The type of material and the thickness of the material may vary in alternative embodiments. In FIG. 21, the external connectors 164 are provided along opposed edges of IC assembly 150*b*. In further embodiments of the present system, it is understood the external connectors 164 may be provided along one edge, three edges, or all four edges of IC assembly 150*b*. While recesses for five external connectors 164 are shown on each of the two opposed sides of IC assembly 150*b* in FIG. 18, it is understood that many more than five external connectors 164 may be provided in embodiments of the present invention.

After the external connectors 164 are applied, semiconductor packages 160*a* and 160*b* may be joined together to form external connector stacked semiconductor package assembly 170 in a step 284 as shown in FIG. 21. The packages 160*a* and 160*b* are joined with the contact pads 154*a* of package 160*a* electrically coupled with the head portion of external connectors 164 in package 160*b*. The package 160*a* may be aligned to the package 160*b* for coupling using a jig or other fixture of known construction.

Figure 22:
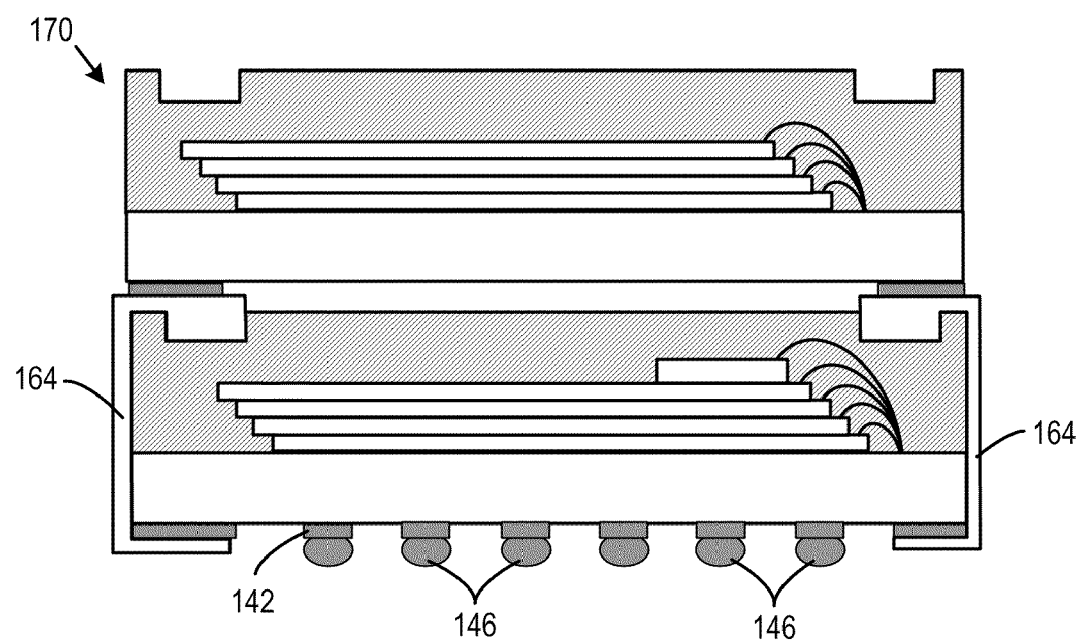

In embodiments where the external connector stacked semiconductor package assembly 170 is to be a BGA package, solder balls may be affixed to package assembly 170. As shown in FIG. 22, solder paste 142 may be applied to the grid of metal contacts on the lower surface of assembly, and the solder balls 146 may be tacked to solder paste 142 in step 286.

Where the external connector stacked semiconductor package assembly 170 is used as a portable device, step 286 may be omitted. Whether assembly 170 is a BGA package with solder balls 146 or an LGA package, all solder connections may be cured in a reflow process in step 288. These solder connections include those between the packages 160*a*, 160*b* and the electrical connectors 164, and, where applicable, the solder balls 146.

The assembly 170 may be tested in a step 290. In embodiments where assembly 170 comprises a portable semiconductor device, the assembly 170 may be encased within lids in a step 292. When the assembly 170 is used as a dedicated device soldered to a motherboard of a host device, step 292 may be omitted.

The internal connectors 130 and external connectors 164 of the above described embodiments serve to electrically couple the semiconductor packages in the assembly to each other. As would be appreciated by those of skill in the art, the conductance pattern(s) in the respective semiconductor packages may be configured in a known manner such that, once the packages are coupled together via the internal/external electrical connectors, the semiconductor die in one package are electrically coupled to the semiconductor die and/or solder balls 146 or other external electrical connector in the second package. Thus, once soldered together, the package assembly may function as a single electronic component, such as for example a single flash memory device. Where the flash memory device is a dedicated component, the device may be an iNAND BGA. Where the flash memory device is a portable component, the device may be an SD LGA. Other devices are contemplated.

It will be evident that the semiconductor packages which are coupled together need not originate from the same substrate panel. Thus, a first substrate panel may include all identical semiconductor packages, such as for example having a controller and one or more flash memory chips. And a second substrate panel may include all identical semiconductor packages, such as for example having only flash memory chips. Packages from these respective panels may then be coupled by the internal or external electrical connectors as described above.

In the above described embodiments, the package assembly is comprised of two semiconductor packages of the same or similar footprint. However, it is understood that the package assembly according to either the internal or external connector configuration may include more than two semiconductor packages. Similarly, the packages within the assembly need not be the same size as each other in alternative embodiments.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of assembling a semiconductor package assembly, comprising the steps of:

(a) forming a first integrated circuit assembly including a substrate having a surface on which one or more semiconductor die mounted and on which a plurality of contact pads are defined;
(b) encapsulating the first integrated circuit assembly with a mold compound;
(c) forming a plurality of recesses in a surface of the mold compound;
(d) affixing a plurality of electrical connectors to the first integrated circuit assembly after said steps (b) and (c) first portions of the electrical connectors connected to the plurality of contact pads and second portions of the electrical connectors being received within respective recesses formed in the mold compound in said step (c);
(e) forming a second integrated circuit assembly including a substrate having a surface on which one or more semiconductor die mounted and on which a plurality of contact pads are defined;
(f) encapsulating the second integrated circuit in a mold compound;
(g) affixing the first and second encapsulated integrated circuits to each other with the second portions of the electrical connectors being electrically coupled to a plurality of contact pads on the second integrated circuit.

2. The method as recited in claim 1, wherein said step (c) of forming the plurality of recesses in the surface of the mold compound occurs during said step (b) of encapsulation.

3. The method as recited in claim 1, further comprising the step (g) of defining contact fingers on a second surface of the substrate to define an LGA device.

4. The method as recited in claim 1, wherein said step (c) of forming the plurality of recesses in the surface of the mold compound comprises the step of forming the recesses along a single edge of the surface.

5. The method as recited in claim 1, wherein said step (c) of forming the plurality of recesses in the surface of the mold compound comprises the step of forming the recesses along two edges of the surface.

6. The method as recited in claim 1, wherein said step (c) of forming the plurality of recesses in the surface of the mold compound comprises the step of forming the recesses along three edges of the surface.

7. The method as recited in claim 1, wherein said step (c) of forming the plurality of recesses in the surface of the mold compound comprises the step of forming the recesses along four edges of the surface.

* * * * *